(12) United States Patent
Maheshwari

(10) Patent No.: US 7,474,545 B1
(45) Date of Patent: Jan. 6, 2009

(54) SOFT PRIORITY CIRCUIT AND METHOD FOR CONTENT ADDRESSABLE MEMORY (CAM) DEVICE

(75) Inventor: Dinesh Maheshwari, Fremont, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 54 days.

(21) Appl. No.: 11/453,164

(22) Filed: Jun. 13, 2006

Related U.S. Application Data

(60) Provisional application No. 60/689,968, filed on Jun. 13, 2005.

(51) Int. Cl.
*G11C 15/00* (2006.01)
(52) U.S. Cl. .................. 365/49.1; 365/49.17; 365/49.18
(58) Field of Classification Search .................. 365/49, 365/49.1, 49.17, 49.18
See application file for complete search history.

(56) References Cited

U.S. PATENT DOCUMENTS

| | | | |
|---|---|---|---|
| 6,420,990 B1 | 7/2002 | Voelkel | |
| 6,763,426 B1 * | 7/2004 | James et al. | 365/49.17 |
| 6,845,024 B1 * | 1/2005 | Wanzakhade et al. | 365/49.18 |
| 6,910,097 B1 | 6/2005 | Srinivasan et al. | |
| 6,934,795 B2 | 8/2005 | Nataraj et al. | |
| 6,954,823 B1 * | 10/2005 | James et al. | 365/49 |
| 7,000,066 B1 | 2/2006 | Wanzakhade et al. | |
| 7,017,089 B1 | 3/2006 | Huse | |
| 7,054,993 B1 | 5/2006 | Srinivasan et al. | |
| 7,117,301 B1 * | 10/2006 | James et al. | 711/108 |
| 7,185,141 B1 * | 2/2007 | James et al. | 711/108 |
| 2005/0001744 A1 * | 1/2005 | Roth et al. | 341/50 |

\* cited by examiner

*Primary Examiner*—Thong Q Le
(74) *Attorney, Agent, or Firm*—Haverstock & Owens, LLP

(57) ABSTRACT

A content addressable memory (CAM) device can include a plurality of CAM super-blocks each comprising a plurality of sub-blocks. Each sub-block can include a plurality of CAM entries that generate match results in response to a key value. For each sub-block there can be storage for a programmable local priority value that establishes priority of match results of the sub-block with respect to match results of the other sub-blocks of the same CAM super-block. In addition, for each sub-block there can be a programmable global priority value, different from the programmable local priority value, that establishes priority of match indications of the sub-block with respect to match results of sub-blocks of the plurality of CAM super-blocks.

20 Claims, 8 Drawing Sheets

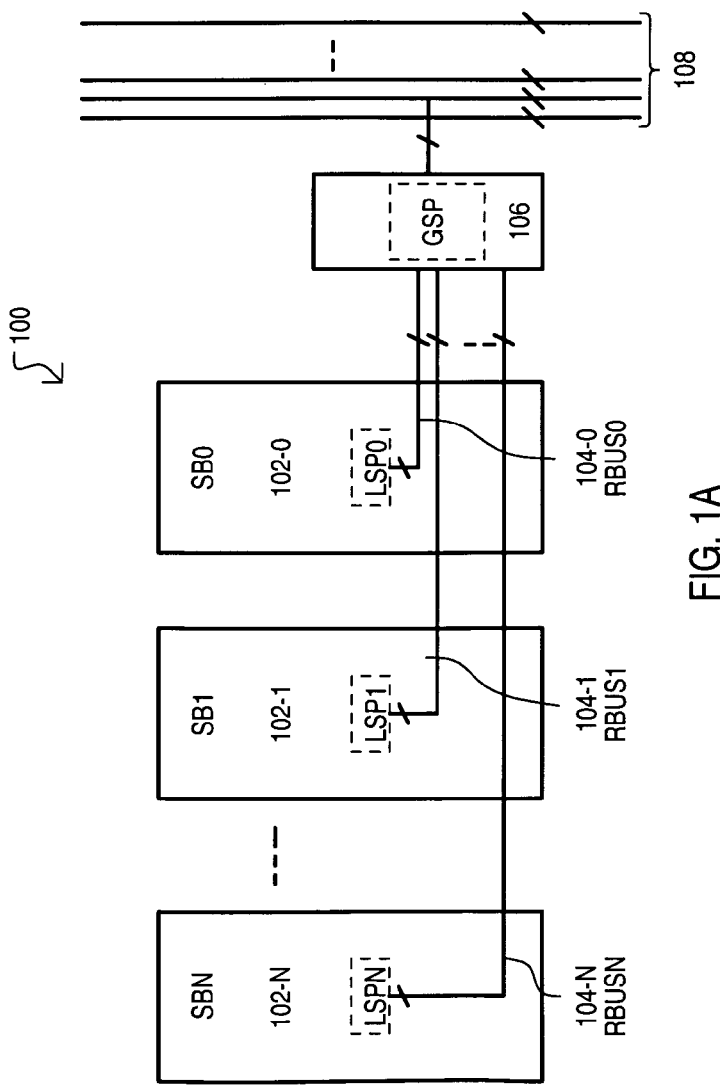
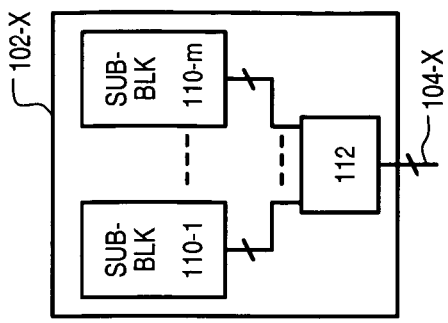
FIG. 1A
FIG. 1B

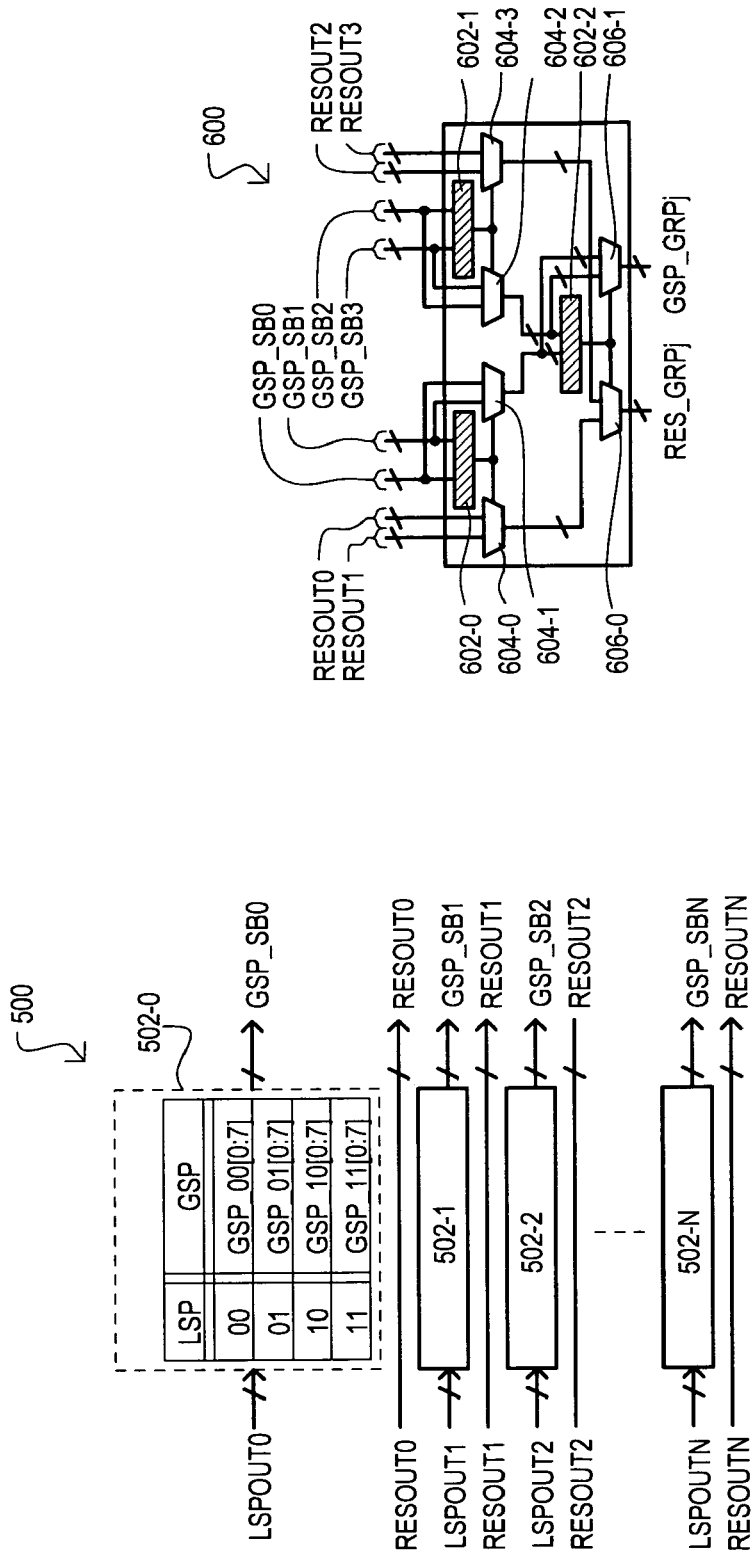

US 7,474,545 B1

SOFT PRIORITY CIRCUIT AND METHOD FOR CONTENT ADDRESSABLE MEMORY (CAM) DEVICE

This application claims the benefit U.S. Provisional Patent Application Ser. No. 60/689,968 filed Jun. 13, 2005, the contents of which are incorporated by reference herein.

TECHNICAL FIELD

The present invention relates generally to content addressable memory (CAM) devices, and more particularly to a CAM device that can provide programmable priority values to different sections of a CAM device.

BACKGROUND OF THE INVENTION

Content addressable memory (CAM) devices, sometimes also referred to as "associative memories", can provide rapid matching functions between an applied data value (e.g., a search key, comparand, or compare data value) and stored data values (e.g., entries). Such rapid matching functions are often utilized in routers, network switches, and the like, to process network packets.

Most CAM devices have an inherent "hard" priority between entries, usually established according to physical location (e.g., address). In addition, some CAM devices have included "soft" priority values that allow sections of a CAM device to be programmed to have a particular priority with respect to other sections of the same CAM device.

A conventional CAM device having soft priority capabilities is shown in a block schematic diagram in FIG. 9. A CAM device can have a number of "super-blocks" (shown as SB0 to SB3), each of which can include a number of "m" sub-blocks. Each super-block can include a corresponding result prioritizer RP0 to RP3. Each result prioritizer can receive a sub-block result and soft-priority value for each sub-block of the corresponding super-block. In one particular example, a sub-block result can include an address value of nineteen bits while a soft-priority value can be an eight-bit value. A result prioritizer can determine a highest priority result from the sub-blocks of the corresponding super-block.

Referring to FIG. 9, in operation, a winning (i.e., highest priority) match result from the sub-blocks within super-block SB3 (and any upstream super-blocks) can be forwarded to result prioritizer RP2 as a super-block SB3 result. Result prioritizer RP2 can determine a highest priority result from among its own sub-block results as well as the received super-block result from RP3, and output its own super-block result to the next super-block downstream (in this case super-block SB1).

In this way, super-block results are prioritized in a cascaded fashion to generate a prioritized super-block group result.

FIG. 10 shows a result prioritizer 1000 like those shown as RP0 to RP3 in FIG. 9. Result prioritizer 1000 can receive match results and local priority values from sub-blocks of a super-block. FIG. 10 shows an example in which match results and soft priority values are received for four sub-blocks. First comparators 1002-0 and 1002-1 can compare soft priority and match result value to control corresponding multiplexers (MUXs) 1004-0 to 1004-3 to output a higher priority match result and soft priority values. These values can be further prioritized by comparator 1002-2, which can control MUXs 1006-0 and 1006-1, which can output a highest priority match result and soft priority value, respectively, from among all sub-blocks.

Comparator 1008 can compare a highest priority match result from the sub-blocks of the corresponding super-block with those of a received "upstream" super-block. Comparator 1008 can control MUXs 1010-0 and 1010-1, which can output a highest priority match result and soft priority value, respectively, from among all sub-blocks.

It is understood that the comparators described above compare sub-block match results and soft-priority values with one another, and so can be relatively large circuits. Thus, if a match result was a nineteen-bit value and a soft-priority value was and eight bit value, such comparators would compare at least 27 bits with one another.

A drawback to a conventional approach, like that of FIG. 10 can be the propagation time involved in having results propagate through multiple result prioritizers (e.g. RP0 to RP3). This introduces considerable delay into a time critical path (match result path) of a CAM device.

A second conventional CAM device having soft priority capabilities is shown in a block schematic diagram in FIG. 11. A CAM device can have a number of "super-blocks" (shown as SB0 to SB5), each of which can include a number of "m" sub-blocks (in the example shown, m=4). Each super-block can include a corresponding result prioritizer (RP0 to RP5). In one arrangement, each super-block includes a 1 to 4 de-multiplexer. Sub-block match results and soft priority values can be driven between super-blocks on a super-block bus, which can include m buses.

In the conventional approach of FIG. 11, each super-block can drive sub-block results (with corresponding soft priority values) onto corresponding result buses.

A drawback to the approach of FIG. 11 can be the size of result buses. For example, in one arrangement, each result bus can include 28 bus lines: 19 address lines, one hit indication line, and 8 soft-priority lines. This results in a total of 112 bus lines. All of the above can require large substrate and/or routing areas.

BRIEF DESCRIPTION OF THE DRAWINGS

FIG. 1A is a block schematic diagram of a content addressable memory (CAM) device according to a first embodiment of the present invention. FIG. 1B is a block schematic diagram of a super-block that can be included in the CAM device of FIG. 1A.

FIG. 5 is a block schematic diagram of a priority translator according to an embodiment of the present invention.

FIG. 6 is a block schematic diagram of group priority circuit according to an embodiment of the present invention.

DETAILED DESCRIPTION

Figure 2:
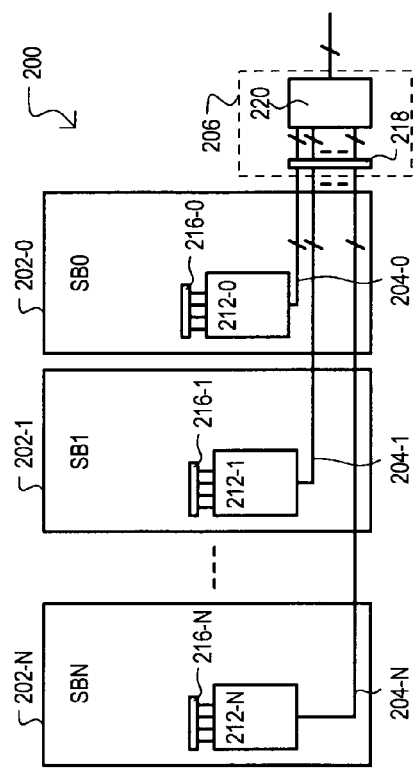
FIG. 2 is a block schematic diagram of a CAM device according to a second embodiment of the present invention.

The various embodiments show devices and methods for establishing soft (i.e., programmable) priority between various sections of a content addressable memory (CAM) device. According to embodiments, CAM device sections can be organized into groups having local priority values that indicates a relative priority among the sections of the group. Such a local priority value can be utilized to access a global priority value that indicates a priority of each section with respect to all other such sections.

Referring now to FIG. 1, a CAM device according to a first embodiment is shown in a block schematic diagram and designated by the general reference character 100. A CAM device 100 can include a number of super-blocks (SB0 to SBN) 102-0 to 102-N, a result priority bus 104-0 to 104-N corresponding to each SB (102-0 to 102-N), a SB group prioritizer 106, and a SB group result bus 108.

Referring now to FIG. 1B, one example of a SB, like those shown as 102-0 to 102-N in FIG. 1A, is shown in block schematic diagram and designated by the reference character 102-X. A SB 102-X can include a number of sub-blocks 110-1 to 110-$m$ and a local result prioritizer 112. Each sub-block (110-1 to 110-$m$) can include a number of CAM entries that store values for comparison to a compare data value (i.e., key, comparand, or compare data value) to generate a match result. Each sub-block (110-1 to 110-$m$) can provide a local priority result to local result prioritizer 112. For example, if a compare data value is determined to match value in one or more CAM entries of a sub-block, a local priority value for such sub-blocks can be provided to the local result prioritizer 112. In addition, each sub-block can provide a match result, such as an index value, or the like.

A local result prioritizer 112 can prioritize local priority results (e.g., local soft priority values and index values) from sub-blocks (110-1 to 110-$m$) of a super-block 102-X, and provide such outputs on a corresponding result priority bus 104-X.

In this way, a super-block 102-X can provide a local priority result that reflects a highest priority result from one of m sub-blocks, and not sub-blocks of any other super-block. As a result, a result priority bus 104-X can include $\log_2(m)$ bus lines, which can be substantially smaller than a bus carrying a global priority result reflective of a priority from among all sub-blocks of a CAM device.

Referring back to FIG. 1A, each super-block (102-0 to 102-N) can provide a local priority result, LSP0 to LSPN, reflective of a highest priority result from among the sub-blocks of the respective super-block. Local priority results LSP0 to LSPN can be provided on corresponding result priority buses 104-0 to 104-N, respectively, to SB group prioritizer 106.

SB group prioritizer 106 can receive local priority results (LSP0 to LSPN) from a group of SBs (102-0 to 102-N). Within SB group prioritizer 106, each local priority result (LSP0 to LSPN) can index to a global soft priority (GSP) value corresponding to the local priority result. Thus, if each of super-blocks (102-0 to 102-N) had "m" sub-blocks, then a SB group prioritizer 106 can contain m×(N+1) GSP values. A local result prioritizer 112 can prioritize GSP values indexed by "winning" LSP values from each SB (102-0 to 102-N), to arrive at the GSP value for a highest priority sub-block. Such a highest priority GSP can be output on SB group result bus 108.

Unlike the above conventional approaches, in CAM device 100, each SB of the group can drive a corresponding result bus that is not shared. Thus, in FIG. 1A, result priority bus (104-0 to 104-N) can provide an essentially direct route from its respective SB to SB group prioritizer 106. As a result, there can be no cascading of result data, and results can be provided for the group of SBs (102-0 to 102-N) in a faster manner than conventional approaches.

In this way, SB group prioritizer 106 can receive SB local priority results "directly".

Also, local soft-priority value within a SB can be established according to the global soft priority values of each sub-block of the super-block. Still further, global soft priority values for sub-blocks can be retained in a group prioritizer 106, and can be selected based on the particular values received from a highest priority sub-block of a SB.

FIG. 2 shows a block schematic diagram of a CAM device 200 according to another embodiment of the present invention. CAM device 200 can include some of the same general sections as CAM device 100 of FIG. 1A, thus like references are referred to by the same reference character but with the first digit being a "2" instead of a "1".

In the particular example of FIG. 2, each SB (202-0 to 202-N) can include a corresponding local soft-priority (LSP) register 216-0 to 216-N in addition to a local result prioritizer 212-0 to 212-N. A LSP register 216-0 to 216-N can store LSP values for establishing priority of sub-block compare results within the same SB. Preferably, if a number of sub-blocks in a SB is "m", a local soft priority value can be $\log_2 m$ bits. Thus, each local result prioritizer (212-0 to 212-N) can receive a match result and local soft-priority value. When match results occur in multiple sub-blocks (i.e., HITs), a local result prioritizer (212-0 to 212-N), based on the sub-block LSPs, can determine a highest priority match result and its corresponding local soft priority value. Such data can be output on a corresponding result priority bus (204-0 to 204-N). Preferably, each result priority bus (204-0 to 204-N) can have a "direct" path to SB group prioritizer 206, and thus include conductive lines providing a direct electrical connection.

SB group prioritizer 206 can receive a highest priority sub-block and local soft priority result from each SB, and prioritize such results to provide a highest priority sub-block result for all sub-blocks of the group of SBs (202-0 through 202-N).

In the example of FIG. 2, SB group prioritizer 206 can include a priority translator 218 and a group priority circuit 220. A priority translator 218 can derive a global soft priority (GSP) value from each incoming LSP value, and provide such a GSP value with a corresponding match result to group priority circuit 220. Thus, while local result prioritizers (212-0 to 212-N) operate on local soft priority (LSP) values, SB group prioritizer 206 can operate on global soft priority (GSP) values.

In an arrangement like that of FIG. 2, local result prioritizers (212-0 to 212-N) can be advantageously smaller than conventional prioritizer circuits for sub-blocks, as prioritizing can be based on local soft priority values, which can be relatively small bit values, as opposed to global soft priority values.

In this way, each SB of a group of SBs (202-0 through 202-N) can store LSP values for each sub-block, while a SB group prioritizer 206 can store GSP values for all sub-blocks of the group of SBs (202-0 through 202-N).

Figure 3B:
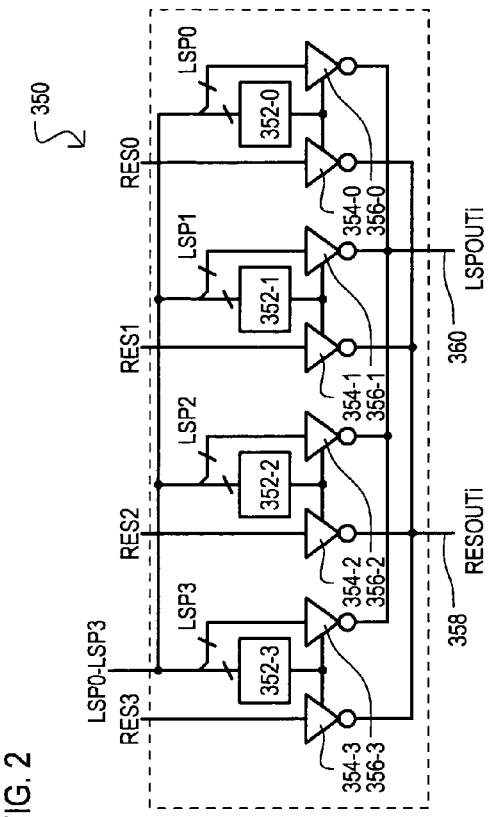
FIG. 3B is a schematic diagram of another local prioritizer circuit according to an embodiment.
Figure 3A:
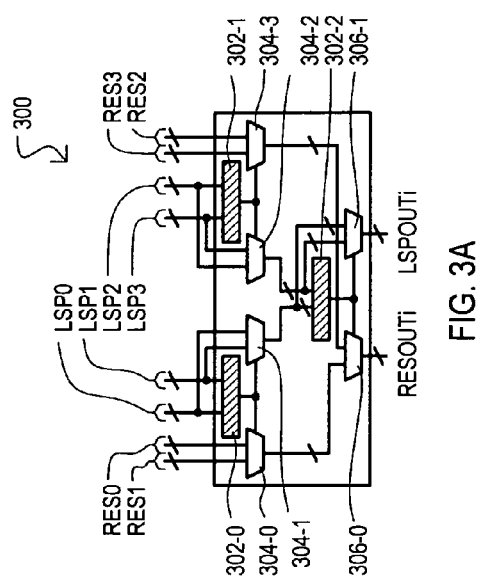
FIG. 3A is a schematic diagram of a local prioritizer circuit according to an embodiment.

FIG. 3A shows one example of a local result prioritizer 300 according to an embodiment. Local result prioritizer 300 can correspond to any of items 112 of FIG. 1B and/or 212-0 to 212-N of FIG. 2. Local result prioritizer 300 can receive match results (RES0 to RES3) and local soft priority values (LSP0 to LSP3) from sub-blocks of a corresponding SB. Match results (RES0 to RES3) can be an index value that indicates an address of a match result, or some other value associated with a matching entry.

FIG. 3A shows an example in which match results and local soft priority values are received for four sub-blocks. First comparators 302-0 and 302-1 can compare local soft priority values to control corresponding multiplexers (MUXs) 304-0 to 304-3 to output a higher priority match result and corresponding local soft priority value. These values can be further prioritized by a comparator 302-2, which can control MUXs 306-0 and 306-1, which can output a highest priority match result (RESOUTi) and the corresponding local soft priority value (LSPOUTi) for such a result, determined from among all sub-blocks of a SB.

As noted above, preferably, local soft priority values (LSP0 to LSP3) can be relatively small bit values as compared to global soft priority values. Consequently, comparators (302-0 to 302-2) can operate on relatively small bit values (e.g., 2 bits for four sub-blocks), leading to an advantageously more compact circuit than conventional arrangements operating on larger bits size global soft priority values.

In this way, a local result prioritizer can operate on smaller local soft priority values rather than larger bit size global soft priority values, for smaller circuit size within a super-block.

FIG. 3B shows an example of a local result prioritizer 350 according to another embodiment. As in the case of FIG. 3A, local result prioritizer 350 can correspond to any of items 112 and/or 212-0 to 212-N. Local result prioritizer 350 can receive match results (RES0 to RES3) and corresponding local soft priority values (LSP0 to LSP3) from sub-blocks of a SB. Like FIG. 3A, FIG. 3B an example in which match results and local soft priority values are received for four sub-blocks.

The particular local result prioritizer 350 of FIG. 3B can include, for each sub-block match result and local soft priority value, a compare logic circuit 352-0 to 352-3, a match result driver 354-0 to 354-3, and a local soft priority driver 356-0 to 356-3.

Each compare logic circuit (352-0 to 352-3) can enable or disable a corresponding match result driver (354-0 to 354-3) and local soft priority driver (356-0 to 356-3). Because a local result prioritizer 350 can operate on a relatively small number of local soft priority bit values, compare logic circuits (352-0 to 352-3) can determine priority in a "decoding" fashion, as opposed to a conventional formal comparator circuit that may involve "rippling" through multiple bit value comparisons. Particular examples of such an approach are disclosed in more detail below.

Match result drivers 354-0 to 354-3 can have outputs commonly connected to a match result bus 358, while local soft priority drivers 356-0 to 356-3 can have outputs commonly connected to a local priority result bus 360. Buses 358 and 360 can form a direct bus to a group prioritizer (e.g., 206 of FIG. 2, 106 of FIG. 1A).

In this way, a local result prioritizer can determine priority with a single decoding circuit, rather than comparator circuits that activate MUXs. In addition or alternatively, local result prioritizer can directly drive a bus with match results and local soft priority values, rather than multiplex such values through multiple stages.

Figures 4A, 4B:
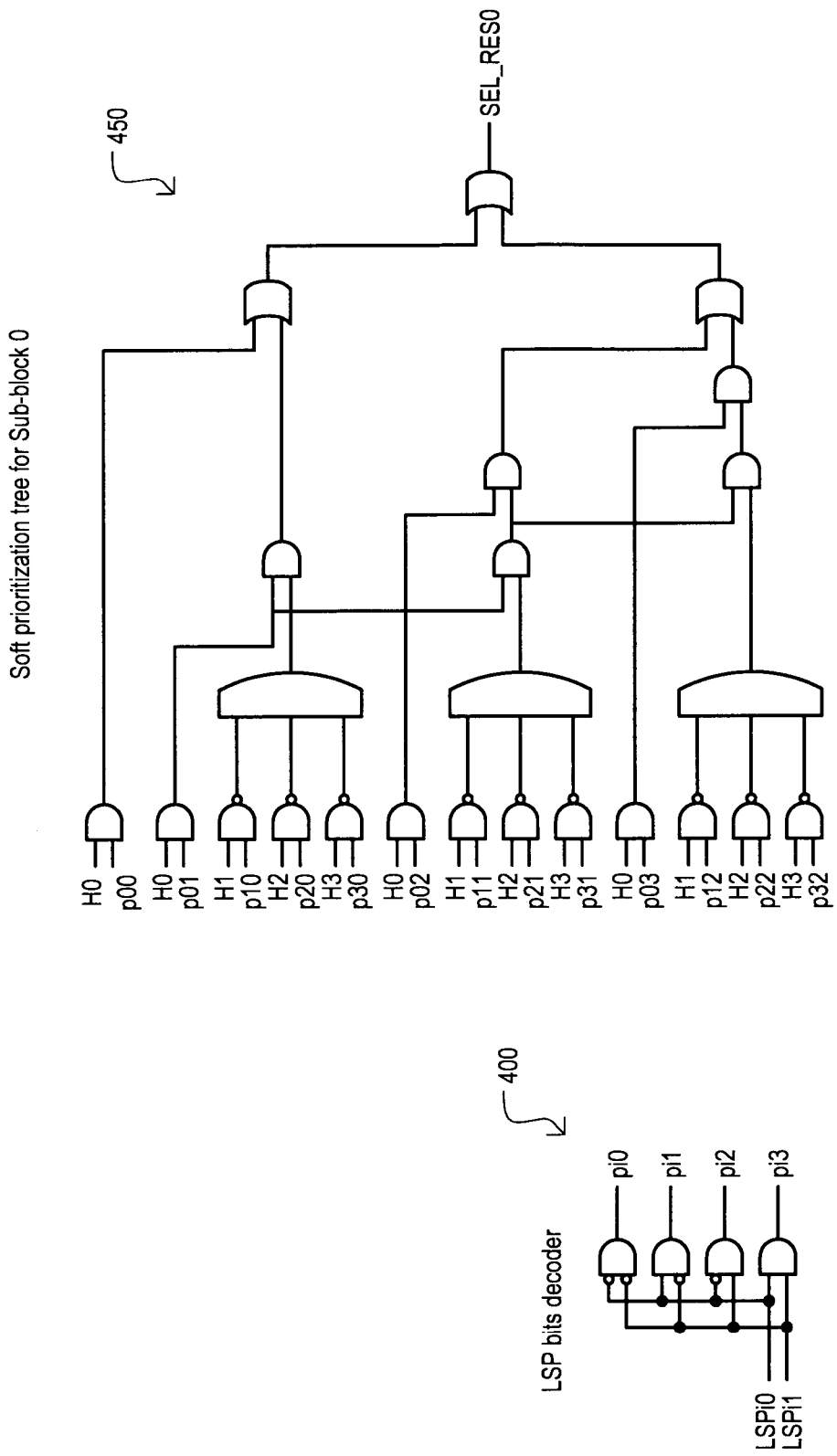
FIG. 4A is a schematic diagram of a local priority value decoder according to an embodiment of the present invention.
FIG. 4B is a schematic diagram of a compare logic circuit according to an embodiment of the present invention.

FIGS. 4A and 4B show circuits that can be included in a compare logic circuit, such as those shown as 352-0 to 352-3 in FIG. 3B. FIG. 4A shows a local soft priority decoder 400 that can decode a soft priority value for each sub-block in a SB. More particularly, FIG. 4A shows the decoding of a two-bit local soft priority value (LSPi0 and LSPi1) into four local soft priority signals (pi0 to pi3).

FIG. 4B shows an example of logic circuits 450 that can be included in a compare logic circuit. In particular, FIG. 4B shows the determination for selecting a local soft priority value and match result value for a sub-block 0. Thus, values H0 to H3 represent hit indications for each sub-block, and will be active (high in this particular implementation) when a CAM entry within the respective sub-block is determined to match an applied compare data value. Values pi0 to pi3 are decoded local soft priority bits for each sub-block, where i indicates a particular sub-block (in this example, sub-blocks 0 to 3). In the arrangement shown, logic circuit 450 will output a select signal SEL_RES0 that will select the match result and local soft priority value of sub-block 0 (from 0-3). The logic circuit for selecting remaining sub-block results follows from the example of FIG. 4B, with input values being switched appropriately, as would be understood by those skilled in the art.

The particular four sub-block processing logic circuit 450 of FIG. 4 can be relative compact, being implemented with a relatively small number of gates (e.g., 27 NAND2 equivalent gates). The circuit can also be relatively fast, with an effective depth equivalent to 9 NAND2 gates.

In this way, a local priority can be determined with a decoding operation, rather than a series of magnitude compare operations.

FIG. 5 shows one example of a priority translator 500 like that shown as 218 in FIG. 2. A priority translator 500 can include a translator circuit 502-0 to 502-3 for each super-block. Each translator circuit (502-0 to 502-3) can receive a local soft priority value (LSPOUT0 to LSPOUTN) corresponding to a sub-block, and in response thereto, can output the global soft priority value (GSP_SB0 to GSP_SBN) for the sub-block. FIG. 5 shows the particular example of two-bit local soft priority values LSP[0:1] indexing into 8-bit global soft priority values GSP_00[0:7] to GSP_11[0:7]. One skilled in the art would recognize such circuits could take various forms, including but not limited to look-up tables, and the like.

Priority translator can also pass through a SB match result value (RESOUT0 to RESOUTN) corresponding to each global soft priority value (GSP_SB0 to GSP_SBN). Such a match result (RES_SB0 to RES_SBN) can be passed through on a bus and/or buffered.

In this way, a priority translator 500 can forward both match result and global soft-priority values for the highest priority sub-block results of multiple SBs.

FIG. 6 shows one example of a group priority circuit 600, like that shown as 220 in FIG. 2. A group priority circuit 600 can take the same general form as the local result prioritizer of FIG. 3A. As a result, like sections are shown with the same reference character, but with the first digit being a "6" instead of a "3". However, it is understood that group priority circuit 600 can operate on global soft priority values, which are preferably larger in bit size, rather than smaller local soft priority values. In this way, a group priority circuit 600 can provide a group global soft priority value GSP_GRPj that has a highest priority from among all sub-blocks having a match in the group of SBs. In addition, a result for such a match RES_GRPj can also be provided.

Figure 7:
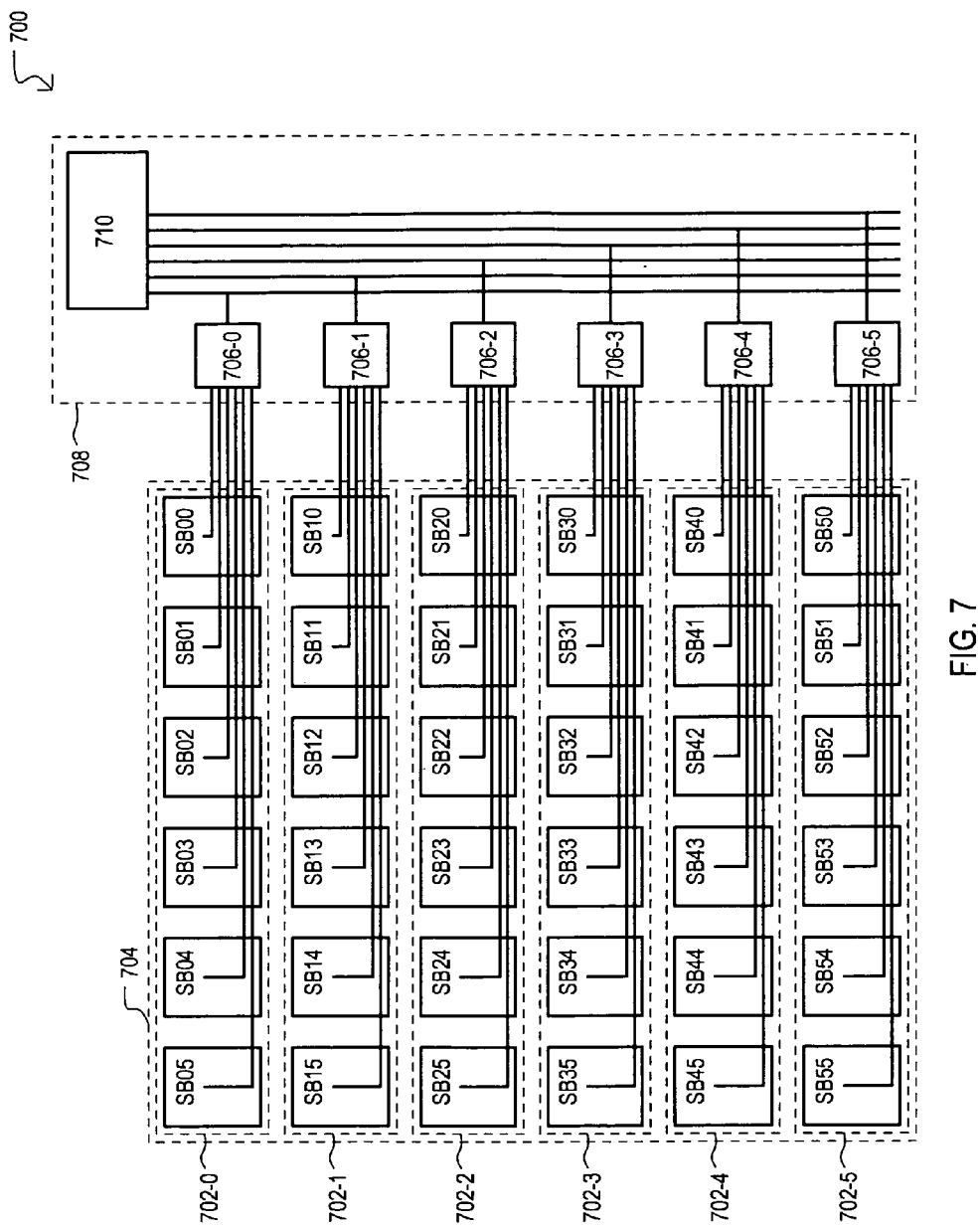
FIG. 7 is a block schematic diagram of CAM device according to a third embodiment of the present invention.

FIG. 7 shows one example of a CAM device 700 according to a third embodiment. CAM device 700 can include a number of SBs (SB00 to SB55), arranged into groups 702-0 to 702-5. In the particular example of FIG. 7, six SBs can be repeated six times' and situated in an array area 704. Each SB (SB00 to SB55) can include CAM cell arrays arranged into a number of sub-blocks each having a local priority encoder circuit. In addition, each SB can have registers for storing local soft priority (LSP) values for each sub-block, and corresponding local result prioritizers for determining a highest priority match from among sub-blocks based on LSP values.

Group priority circuits 706-0 to 706-5 for each group (e.g., row) of SBs can be situated in a peripheral "spine" area 708. In this way, prioritization involving larger numbers of bits (i.e., global soft priority) can be situated outside of an array area 704, allowing for a denser array area 702 and/or greater flexibility of circuit placement in the array area 702.

CAM device 700 also includes an inter-group prioritizer 710 that can use match result values and global soft-priority values from each group priority circuit (706-0 to 706-5) to decide an overall highest priority result from all SBs.

The above embodiments can provide for two or more levels of programmable priority. A first priority, a local soft priority (LSP) can be a relative priority from among all sub-blocks of a single SB. A second priority, a global soft priority (GSP), can be a priority from among all sub-blocks of all SBs. In one embodiment, such LSP and GSP values can be stored in registers of a CAM device.

Figure 8:
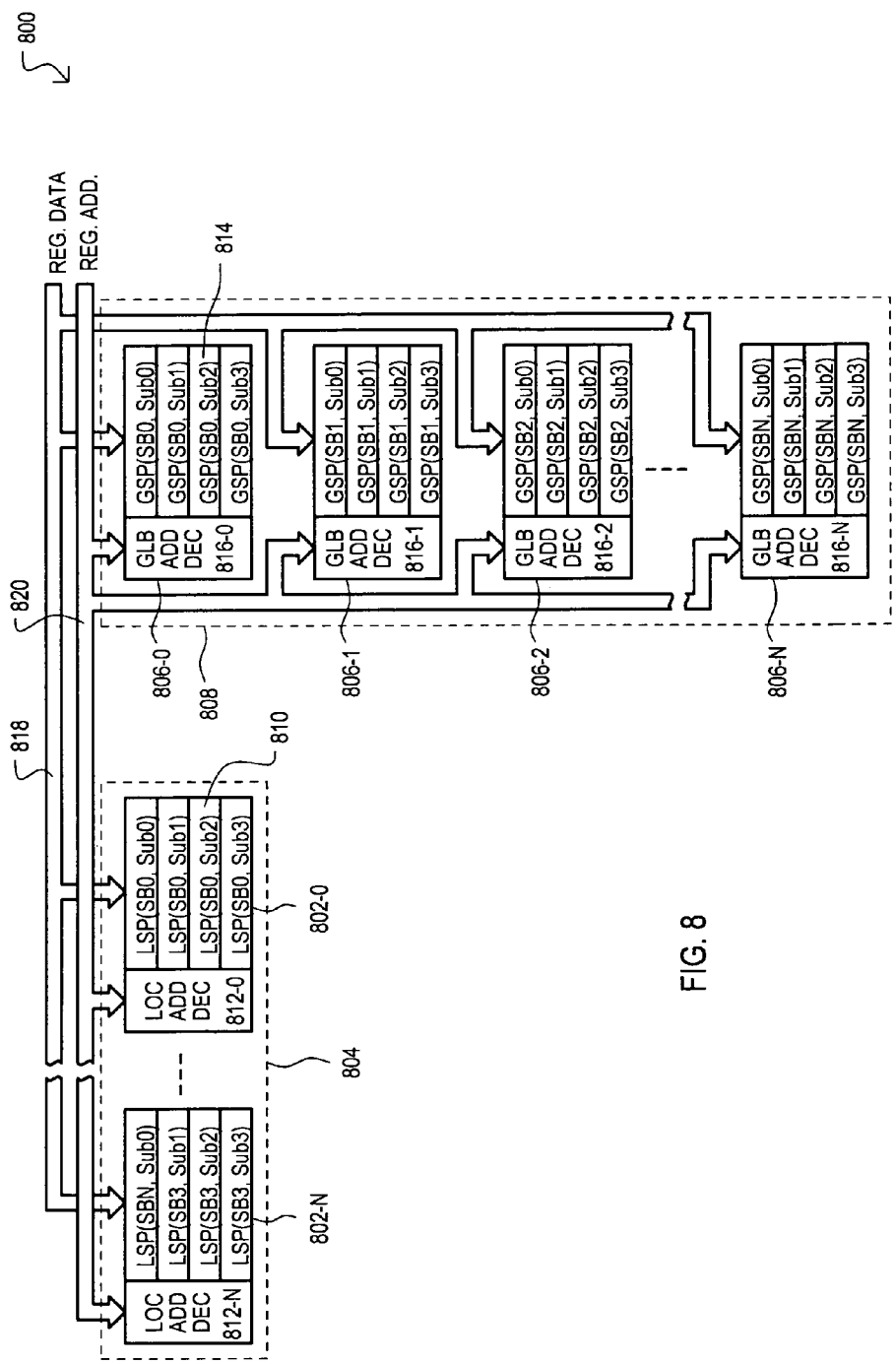
FIG. 8 is a block schematic diagram of a global and soft priority register arrangement according to one embodiment.
Figures 9, 10:
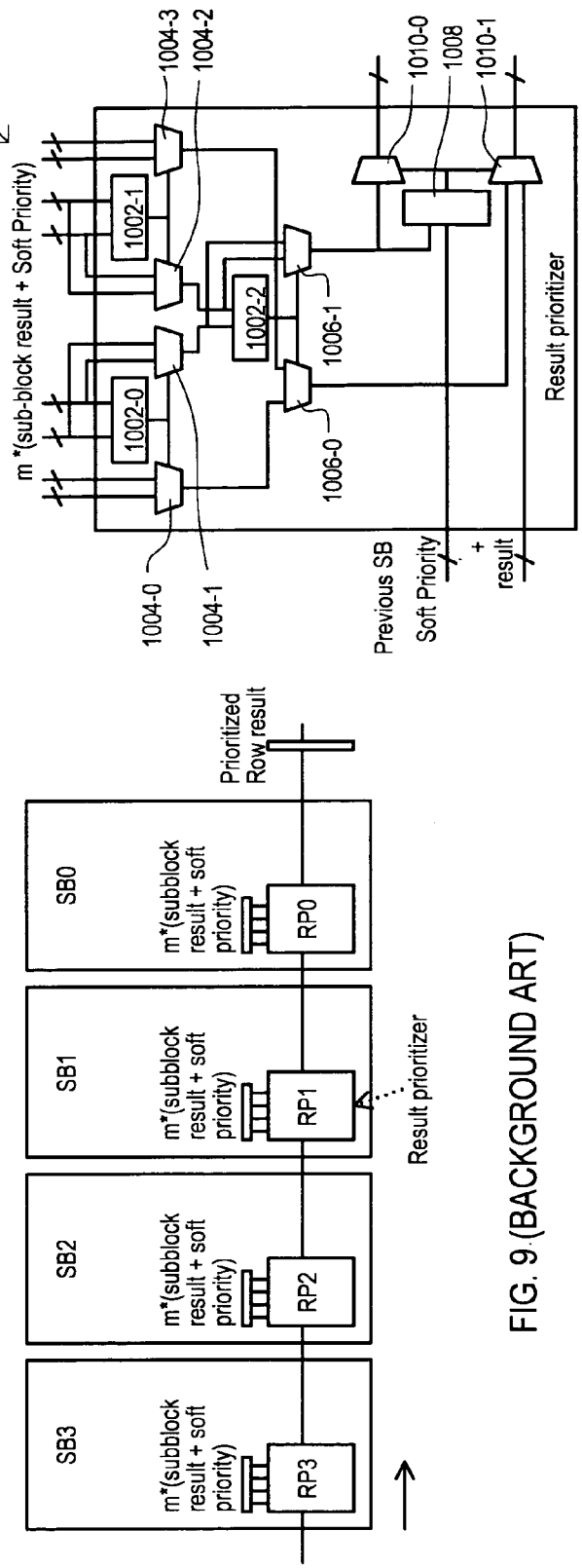
FIG. 9 is a block schematic diagram of a first conventional CAM device having soft-priority on a sub-block basis.
FIG. 10 is a block schematic diagram of a result prioritizer utilized in the conventional CAM device of FIG. 9.
Figure 11:
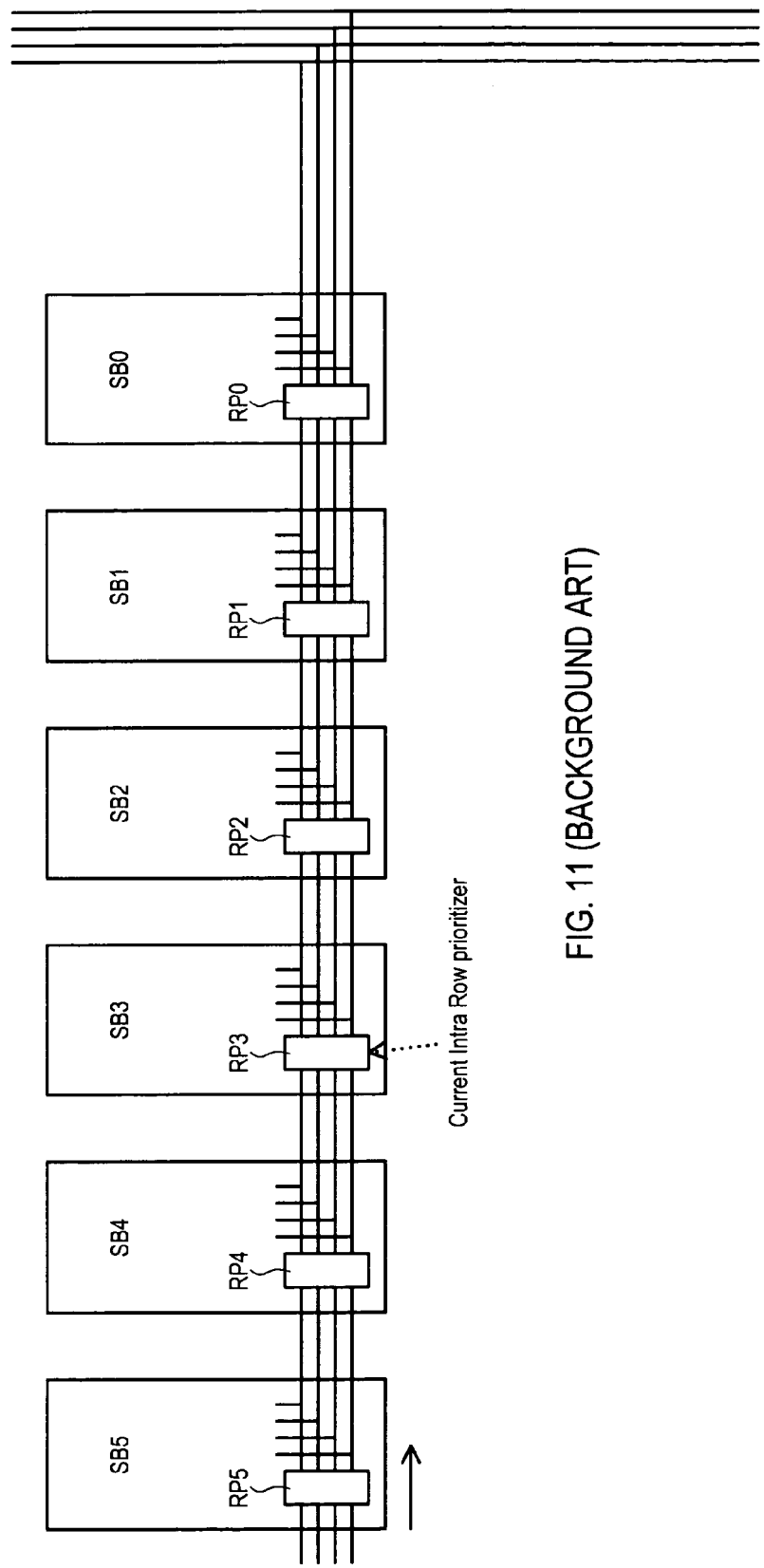
FIG. 11 is a block schematic diagram of a second conventional CAM device having soft-priority on a sub-block basis.

FIG. 8 shows one particular register mapping arrangement of a CAM device according to one embodiment. In FIG. 8, a register mapping arrangement 800 can include a number of LSP register sets (802-0 to 802-N) formed in an array area 804, as well as a number of GSP register sets (806-0 to 806-N) formed in a peripheral area 808. FIG. 8 shows an arrangement for a CAM having "N+1" SBs, each of which includes four sub-blocks. LSP register sets (802-0 to 802-N) can each include storage registers for storing LSB values (LSP(SB0, Sub0) to LSP(SBN, Sub3), one of which is shown as 810, as well as a local register address decoder (812-0 to 812-N). Similarly, GSP register sets (806-0 to 806-N) can each include storage registers for storing GSP values (GSP(SB0, Sub0) to GSP(SBN, Sub3), one of which is shown as 814, as well as a global register address decoder (816-0 to 816-N).

LSP or GSP values can be written into a register by accessing the register according to an address on a register address bus 820 and placing the value to be written on a register data bus 818.

In this way, local and global soft priority values can be written to a CAM device.

Of course, local soft priority values can be generated via circuits from the corresponding global soft priority values in other embodiments. Further, multiple priority values may be written with a single address. For example, while a single register address may correspond to X global priority values (where X>0), a single register address may also correspond to a greater number Y of local priority values (Y>X).

The above embodiments may be advantageously faster than conventional approaches as match results do not have to cascade through multiple prioritizing circuits.

The above embodiments may be advantageously more compact in an array area, as priority within a sub-block may be determined by circuits operating on a local soft priority value that is smaller than a global soft priority value.

The above embodiments may be advantageously scalable. Result bus growth can be proportional to the number of SBs, not the number of global soft priority value bits.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A content addressable memory (CAM) device, comprising:
a plurality of CAM super-blocks each comprising a plurality of sub-blocks, each sub-block including a plurality of CAM entries that generate match results in response to a key value; wherein
the CAM device includes, for each sub-block, storage for a programmable local priority value that establishes priority of match results of the sub-block with respect to match results of the other sub-blocks of the same CAM super-block, and
a programmable global priority value, different from the programmable local priority value that establishes priority of match indications of the sub-block with respect to match results of sub-blocks of the plurality of CAM super-blocks.

2. The CAM device of claim 1, wherein:
the number of sub-blocks in each CAM super-block is N, and the programmable local priority value comprises no more than log2(N) bits.

3. The CAM device of claim 1, wherein:
each CAM entry comprises binary CAM cells arranged into at least one row.

4. The CAM device of claim 1, wherein:
each CAM entry comprises ternary CAM cells arranged into at least one row.

5. The CAM device of claim 1, further including:
the CAM super-blocks being arranged into a plurality of super-block groups;
an intra-group prioritizer corresponding to each super-block; and
a super-block result bus coupled between each super-block and the intra group prioritizer of the respective super block group.

6. The CAM device of claim 5, wherein:
each super-block result bus is a direct connection between the CAM super-block and corresponding intra-group prioritizer with no intermediate circuits.

7. The CAM device of claim 5, further including:
each super-block group comprising CAM super-blocks arranged into a super-block row;
a spine area physically situated at one end of a plurality of super-block rows,
the intra group prioritizers being disposed in the spine area.

8. The CAM device of claim 5, wherein:
each intra group prioritizer includes a translator circuit that generates global soft priority value from sub-block local soft priority values received from each super-block.

9. A content addressable memory (CAM) device, comprising:
at least one group of super-blocks, each comprising a plurality of sub-blocks, each sub-block comprising a plurality of CAM entries that generate match results in response to an applied key value;
an intra-group prioritizer that prioritizes match results between sub-blocks of the at least one group based on at least a physical location of a matching CAM entry and a programmable global priority value for the sub-block containing the matching CAM entry, the programmable global priority value establishing a priority of match results of the sub-block with respect to match results of sub-blocks of multiple super-blocks; and a match result bus for each super-block that provides a direct data path for match results between each super-block and the intra-group prioritizer.

10. The CAM device of claim 9, wherein:
the direct data path comprises uninterrupted conductive lines.

11. The CAM device of claim 9, wherein:
the direct data path comprises buffer circuits that repeat data values along the data path without logically combining such data values with any other values.

12. The CAM device of claim 9, further including:
a local result prioritizer for each super-block that prioritizes match results from each sub-block of the super-block based on a local priority value for each sub-block that is different from the global priority value of the sub-block, each local priority value establishing a priority of match indications between sub-blocks of the same super-block.

13. The CAM device of claim 12, wherein:
the number of sub-blocks in each super-block is N, priority between sub-blocks of the same super-block is established with no more than N signals.

14. The CAM device of claim 13, further including:
a decoder that decodes a local soft priority value of log2(N) bits into the at least N signals.

15. The CAM device of claim 12, wherein:
each local result prioritizer comprises
a plurality of first level local compare circuits that compare at least local priority values with one another to generate first level priority selection signals,
a plurality of first level MUXs that output compare results and local priority based on the first level priority selection signals,
at least one second level local compare circuit that compares at least the local priority values output from the first level MUXs to generate at least one second level priority selection signal, and
at least one second level MUX that outputs compare results and local priority based on the at least one second level priority selection signal.

16. The CAM device of claim 12, wherein:
each local result prioritizer comprises, for each sub-block,
a local priority logic circuit that activates a driver signal when the match result for its sub-block has a highest priority,
a match result driver enabled in response to the driver signal having an input that receives the match result from the sub-block and an output coupled to the match result bus of super-block, and
a priority result driver enabled in response to the driver signal having an input that receives the local soft priority from the sub-block and an output coupled to the match result bus of super-block.

17. The CAM device of claim 16, wherein:
each local priority logic circuit
receives priority signals corresponding to the local priority of each sub-block of the super-block and a hit indication that corresponds to a match result of each sub-block, each hit indication having one logic value when a match result indicates a match state and another logic value when the match result indicates a non-match state, and includes
a plurality of first logic gates that each logically combines the hit indication of the sub-block with a different priority signal corresponding to the sub-block,
a plurality of second logic gates that each logically combine hit indications of the other sub-blocks of the super-block with a different priority signal of such other sub-blocks, and
a plurality of prioritizing gates that coupled to receive the outputs of the first and second logic gates.

18. The CAM device of claim 9, wherein:
the intra group prioritizer comprises a translator circuit that provides a global priority signal corresponding to each sub-block match result received on each match result bus.

19. A method for providing programmable priority between multiple sub-blocks of a CAM device, comprising:
providing a plurality of super-blocks that each contain a plurality of sub-blocks having multiple CAM entries, each sub-block having a programmable global soft-priority value that establishes a priority of match results among multiple sub-blocks;
establishing a priority of match results among sub-blocks within the same super-block according to programmable local soft priority values;
outputting a highest priority match result from each sub-block; and
establishing a priority of match results among match results output from the super-blocks according to the programmable global soft priority value corresponding to the sub-block generating each match result.

20. The method of claim 19, wherein:
the number of sub-blocks is N;
the programmable local soft priority value has k bits, where k=log2(N); and
the global soft priority value has m bits, where m>k.

* * * * *